United States Patent

Ochiai

[11] Patent Number: 5,626,921
[45] Date of Patent: May 6, 1997

[54] METHOD FOR FORMING PHOTOLUMINESCENCE LAYER ON A SEMICONDUCTOR LAYER BY ION IRRADIATION

[75] Inventor: Yukinori Ochiai, Tokyo, Japan

[73] Assignee: NEC Corporation, Tokyo, Japan

[21] Appl. No.: 381,442

[22] Filed: Jan. 31, 1995

Related U.S. Application Data

[63] Continuation of Ser. No. 982,985, Nov. 30, 1992, abandoned.

[30] Foreign Application Priority Data

| Nov. 29, 1991 | [JP] | Japan | 3-315846 |
| Dec. 10, 1991 | [JP] | Japan | 3-350170 |
| Dec. 20, 1991 | [JP] | Japan | 3-355008 |
| Dec. 28, 1991 | [JP] | Japan | 3-360577 |
| Dec. 28, 1991 | [JP] | Japan | 3-360579 |

[51] Int. Cl.$^6$ .......... C23C 14/14; H05H 1/00; H05H 1/24
[52] U.S. Cl. .......... 427/533; 427/527; 427/535; 427/563; 427/578
[58] Field of Search .......... 427/533, 534, 427/535, 563, 562, 564, 568, 574, 578, 527, 523

[56] References Cited

U.S. PATENT DOCUMENTS

| 3,087,838 | 4/1963 | Lubin | 427/534 |
| 3,671,313 | 6/1972 | Reynolds | 427/534 |
| 4,113,514 | 9/1978 | Pankove et al. | 437/247 |
| 4,266,986 | 5/1981 | Benton et al. | 427/569 |
| 4,315,782 | 2/1982 | Tarng | 427/527 |
| 4,361,461 | 11/1982 | Chang | 427/534 |
| 4,365,013 | 12/1982 | Ishioka et al. | 427/74 |
| 4,472,492 | 9/1984 | Kanbe et al. | 427/554 |
| 4,482,423 | 11/1984 | Besomi et al. | 156/622 |
| 4,571,348 | 2/1986 | Troxell | 427/527 |
| 4,579,609 | 4/1986 | Reif et al. | 427/534 |
| 4,584,028 | 4/1986 | Pankove et al. | 427/527 |
| 4,650,695 | 3/1987 | Gregory | 427/527 |
| 4,752,588 | 6/1988 | Ellis et al. | 250/361 R |
| 4,883,561 | 11/1989 | Gmitter et al. | 156/633 |
| 4,945,065 | 7/1990 | Gregory et al. | 437/24 |
| 4,987,008 | 1/1991 | Yamazaki et al. | 427/534 |
| 5,179,029 | 1/1993 | Gottscho et al. | 427/569 |
| 5,219,797 | 6/1993 | Gerardi et al. | 437/238 |

FOREIGN PATENT DOCUMENTS

| 441024 | 8/1991 | European Pat. Off. . | |
| 4069009 | 3/1989 | Japan | 427/534 |

OTHER PUBLICATIONS

Capasso et al "A Proposed Hydrogenation/Nitration Passivation Mechanism for GaAs & Other III–V Semiconductor Devices, Including InGaAs Long Wavelength Photoelect." *Journal of Electro Chem. Society* pp. 821–825; vol. 129 #4, Apr. 1982.

Bagnoli et al "Electrical Characteristics of Silicon Nitride in Silicon and InGaAs as a Function of the Insulator Stoichiometry", *Applied Surf. Science*, 52(1991) pp. 45–52 (no month).

Wu et al, "Influence of $NH_3$ Plasma Pretreatment on the Properties of Plasma Inhanced CVD SiON in GaAs Interface", *J. Appl. Phys.* 60(6), 15 Sep. 1986, pp. 2050–2057.

Pankove et al, "Passivation of GaAs Surfaces", *J. of Electronic Materials*, vol. 12, No. 2 1983 (no month).

*Hackh's Chemical Dictionary*, Grant, ed., 3$^{rd}$ edition 1994 no month p. 420.

*Primary Examiner*—Marianne Padgett
*Attorney, Agent, or Firm*—Young & Thompson

[57] ABSTRACT

For forming a photoluminescence layer on a semiconductor layer, ions are irradiated to a surface portion of a semiconductor layer where a photoluminescence layer is to be formed, and then, the semiconductor layer is immersed in a solution containing hydrofluoric acid, whereby the ion-irradiated and hydrofluoric-acid-treated portion forms a photoluminescence layer.

5 Claims, 8 Drawing Sheets

METHOD FOR FORMING PHOTOLUMINESCENCE LAYER ON A SEMICONDUCTOR LAYER BY ION IRRADIATION

This application is a continuation of application Ser. No. 07/982,985, filed Nov. 30, 1992, now abandoned.

BACKGROUND OF THE INVENTION

1. Field of the Invention

The present invention relates to a method for forming a photoluminescence layer on a semiconductor layer, and more specifically to a method for forming a photoluminescence semiconductor layer even in a small area or even in large area, with a high reproducibility, a high uniformity, and an excellent mass producibility.

2. Description of Related Art

In the prior art, as regards a photoluminescence semiconductor, there have been many reports using a direct transition semiconductor such as GaAs. In order to form a photoluminescence layer by an indirect transition semiconductor such as Si, it has been foraged by an anodizing using an electrolytic solution mainly composed of hydrofluoric acid and using a silicon substrate as an anode.

For example, an electrode is formed on a rear surface of a substrate in order to increase uniformity of the anodizing. This electrode can be formed by depositing aluminum on the rear surface of the substrate and then by performing a beat treatment at 500° C. for one hour. Thus, the substrate is used as an anode, and a cathode formed of platinum is used. The electrolytic solution is composed of a 49%-aqueous hydrofluoric acid or a mixed liquid of 5 parts of 49%-aqueous hydrofluoric acid and 3 parts of ethanol. A current is applied with a current density of 10 mA/cm$^2$ to 50 mA/cm$^2$ for a few minutes to 30 minutes. Thus, a photoluminescence layer is formed.

In accordance with the an present invention, in order to obtain a uniform photoluminescence region, it is necessary to form an electrode having a uniform contact resistance on the silicon substrate.

However, it is difficult to form the electrode of uniform contact resistance over a large area, and as a result, it is difficult to uniformly anodize the silicon substrate surface. In addition, since the reaction is performed in the solution, a non-uniformity occurs in solution concentration in the process of reaction, and hydrogen bubbles are generated in the proximity of the electrode within the solution also in in the process of reaction. Because of these factors, it is difficult to form a uniform anodized surface.

Accordingly, it is difficult to form a semiconductor region having a uniform photoluminescence intensity. In addition, since it is necessary to form the electrode on the semiconductor substrate, the producibility is low. Furthermore, at the time of forming the electrode on the semiconductor substrate, there is a risk that the substrate is soiled and damaged. In addition, the electrode makes it impossible to form a device on the substrate or makes it necessary to remove the electrode.

From a different viewpoint, there is no attempt for wholly or selectively changing the photouminescence intensity after the photoluminescence region is formed, or for restoring the photoluminescence intensity in the region of reduced or inhibited photoluminescence intensity.

SUMMARY OF THE INVENTION

Accordingly, it is an object of the present invention to provide a method for forming a photoluminescence layer on a semiconductor layer, which overcomes the above-mentioned defects of the conventional method.

Another object of the present invention is to provide a method for forming a photoluminescence layer on a semiconductor layer, which can form a photoluminescence layer having a uniform photoluminescence intensity, on a whole of a portion of a semiconductor substrate surface, with a high producibility, and without soiling or damaging the substrate.

Still another object of the present invention is to provide a method for forming a photoluminescence layer on a semiconductor layer, which is capable of wholly or selectively changing the photoluminescence intensity after the pbotoluminescence region if formed, or restoring the photoluminescence intensity in a region of reduced or inhibited photoluminescence intensity.

The above and other objects of the present invention are achieved in accordance with the present invention by a method for forming a photoluminescence layer on a semiconductor layer, including the steps of irradiating with ions to a surface portion of a semiconductor layer where a photoluminescence layer is to be formed, and then, immersing the semiconductor layer in a solution containing hydrofluoric acid, whereby the ion-irradiated and hydrofluoric-acid-treated portion forms a photoluminescence layer.

In one embodiment, hydrogen ions or ions including hydrogen are used to irradiate the surface portion of the semiconductor layer. The solution is hydrofluoric acid or an aqueous hydrofluoric acid. In addition, the semiconductor layer is formed of indirect transition semiconductor.

According to another aspect of the present invention, there is provided a method for forming a photoluminescence layer on a semiconductor layer, including the steps of exposing a surface of a semiconductor layer to an active atmosphere including hydrogen, so that an exposed portion of the semiconductor layer forms a photoluminescence layer.

In one embodiment, the active atmosphere is a plasma atmosphere including hydrogen, or the active atmosphere is composed of hydrogen ions or ions including hydrogen. Furthermore, the hydrogen ions or ions including hydrogen is irradiate a surface of a semiconductor layer, so that an ion irradiated portions of the semiconductor layer forms a photoluminescence layer. In addition, the semiconductor layer is formed of indirect transition semiconductor.

According to a third aspect of the present invention, there is provided a method for forming a photoluminescence layer on a semiconductor layer, including the steps of irradiating or implanting ions on a surface portion of a semiconductor layer where a photoluminescence layer is to be formed, and exposing the ion irradiated or implanted surface portion of the semiconductor layer to a hydrogen plasma or irradiating with hydrogen ions to the ion irradiated or implanted surface portion of the semiconductor layer, whereby the hydrogen plasma exposed or hydrogen ion irradiated surface portion of the semiconductor layer forms a photoluminescence layer.

The semiconductor layer can be formed of indirect transition semiconductor.

According to a fourth aspect of the present invention, there is provided a method for forming a photoluminescence layer on a semiconductor layer, including the step of heating a semiconductor layer having a photoluminescence layer formed thereon, so that a photoluminescence intensity of the photoluminescence layer is reduced or inhibited.

In addition, the semiconductor layer including the photoluminescence layer having the reduced or inhibited photoiuminescence intensity is immersed in a solution containing hydrofluoric acid, whereby a photoluminescence property of the photohminescence layer is restored. The solution is hydrofluoric acid or an aqueous hydrofluoric acid.

Furthermore, the semiconductor layer including the photoluminescence layer having the reduced or inhibited photoluminescence intensity is irradiated with ions or exposed to plasma, whereby a photoluminescence property of the photoluminescence layer is restored.

The semiconductor layer can be formed of indirect transition semiconductor.

With the above mentioned methods, when the semiconductor photoluminescence layer is formed, it is no longer necessary to form an electrode on the semiconductor layer or substrate, for the purpose of anodizing. In addition, the semiconductor layer or substrate becomes free from soil and damage in the process of formation of the electrode. Since the ion irradiation, the ion implantation and the plasma processing have an excellent uniformity, it is possible to form a photoluminescence region having a uniform photoluminescence intensity over a large area.

Furthermore, if a mask is provided, it is possible to selectively-form the photoluminescence layer.

In accordance with the fourth aspect of the present invention, the photoluminescence intensity of the photoluminescence layer formed on the semiconductor substrate is reduced or inhibited or lost by a heat treatment, but the reduced or inhibited or lost photoluminescence can be restored by treating the semiconductor substrate in a solution containing hydrofluoric acid, or irradidating ions or exposing to the plasma atmosphere. In the photoluminescence intensity reducing or inhibiting processing or the photoluminescence restoring processing, if a mask is formed on a selected area of the phototuminescence layer, a photoluminescence layer can be formed on a selected region.

The above and other objects, features and advantages of the present invention will be apparent from tile following description of preferred embodiments of the invention with reference to the accompanying drawings.

DESCRIPTION OF THE PREFERRED EMBODIMENTS

Embodiment 1

Figure 1:
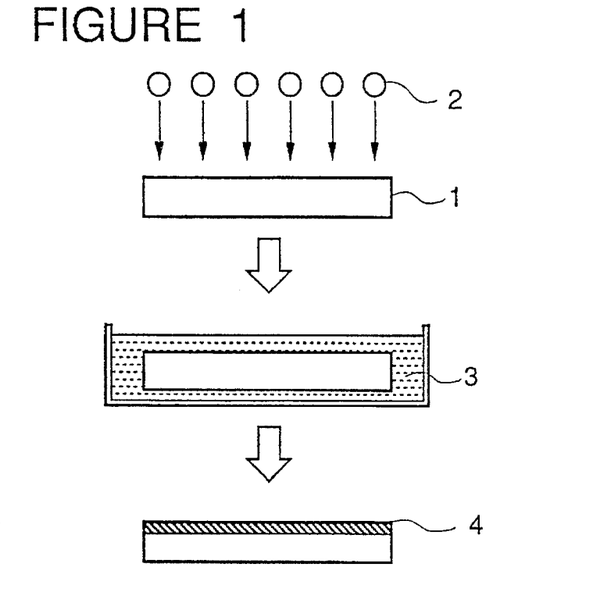
FIG. 1 is a process flow diagram illustrating a first embodiment of the method in accordance with the present invention for forming a photoluminescence layer on a semiconductor layer.

Referring to FIG. 1, there is is shown a process flow diagrąm illustrating a first embodiment of the method in accordance with the present invention for forming a photoluminescence layer on a semiconductor layer.

A substrate 1 is located in an ion irradiating apparatus (not shown), and the substrate is irradiated with ions from a suitable ion source at a suitable dose. As one example, the substrate 1 as an indirect transition semiconductor, and is formed of a P-type or N-type silicon substrate having a (100) orientation suffice. Positive chlorine ions 2 obtained form an ECR ion source are generated under an acceleration voltage of 300 V and with an ion current density of 500 $\mu A/cm^2$ for six minutes. As another example, argon is generated under an acceleration voltage of 300 V to 500 V and with an ion current density of 1 $mA/cm^2$.

By changing the above mentioned irradiation conditions it is possible to control the photoluminescence intensity, the thickness of the photoluminescence layer, and the depth of the photoluminescence layer, after the manufacturing. For example, if the acceleration voltage is increased (to 1 KV for example), the photoluminescence layer can be thickened and the photoluminescence intensity can be strengthened.

After the ion irradiation, the substrate is taken out from the ion irradiating apparatus, and then, is immersed in a hydrofluoric acid solution 3. For example, the hydrofluoric acid solution is composed of a 49%-aqueous hydrofluoric acid, or a mixed liquid of 5 parts of 49%-aqueous hydrofluoric acid and 3 parts of ethanol. The concentration of the hydrofluoric acid and the mixing ratio of the hydrofluoric acid and the ethanol can be changed over a wide range. The photoluminescence intensity can be controlled by the concentration of the hydrofluoric acid and the immersing time. Thus, the ion-irradiated region can form a photoluminescence layer 4.

Confirmation of photoluminescence can be performed by irradiating a visible or ultraviolet exciting ray obtained from an argon laser, a Krypton laser, a mercury lamp, a xenon lamp, etc., and observing an eminent visible or infrared ray. The wavelength of the emitted ray can be controlled by changing the amount of ion irradiation, the acceleration voltage of ions, and/or the immersing time into the hydrofluoric acid or hydrofluoric acid solution.

Figure 3:
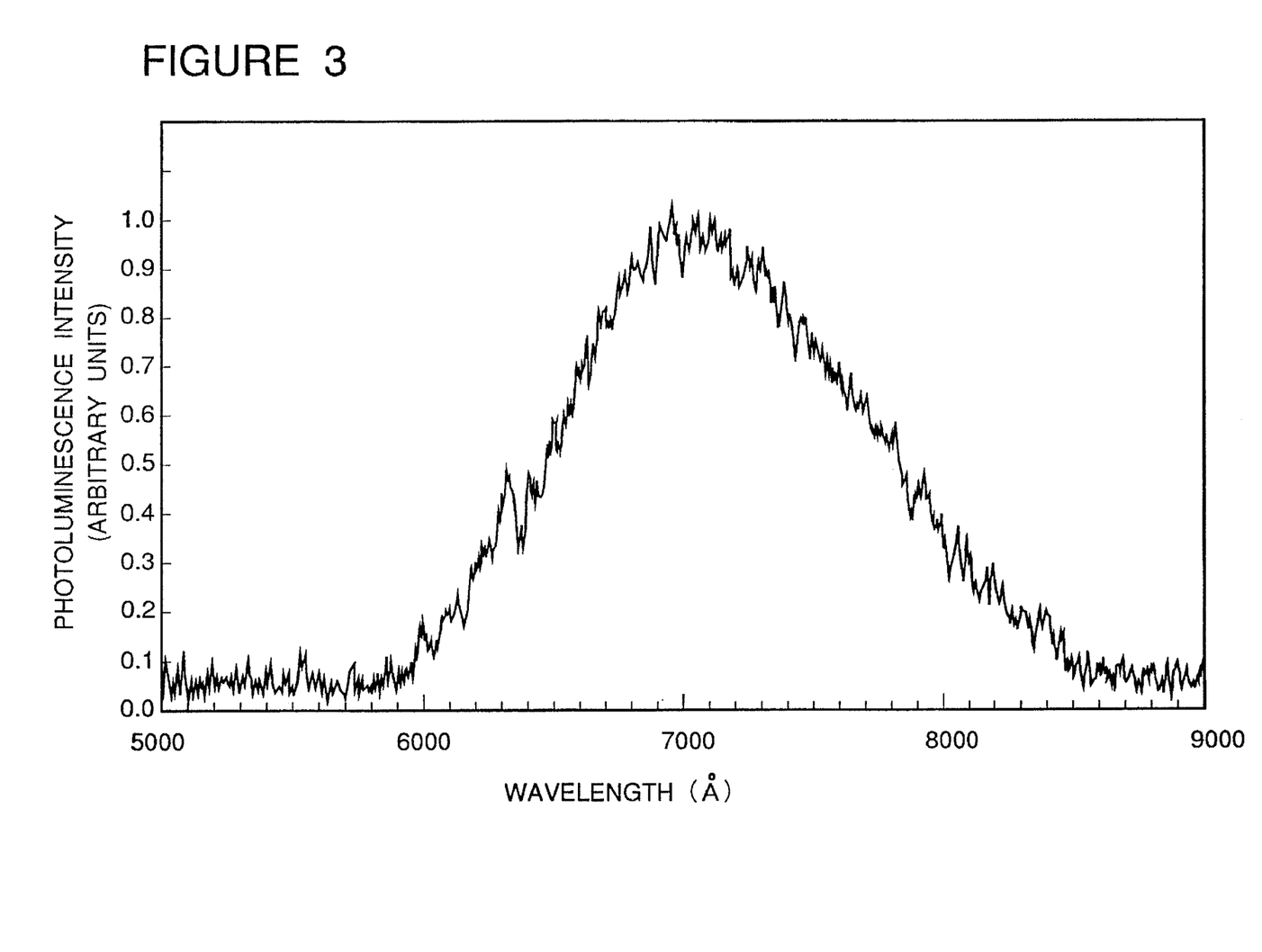
FIG. 3 is a graph illustrating a photoluminescence spectrum of the photoluminescence layer formed in accordance with the embodiment shown in FIG. 1.

Referring to FIG. 3 there is shown a graph illustrating a photoluminescence spectrum of the photoluminescence layer formed in accordance with the embodiment shown in FIG. 1.

A P-type (100) silicon substrate is irradiated with argon under an acceleration voltage of 300 V and at a dose of 1 mA/cm$^2$ for 15 minutes, and thereafter, the substrate is immersed in a 49%-aqueous hydrofluoric acid for 30 minutes. A laser light having the wavelength of 350 nm obtained from the Krypton laser is applied as an exciting ray. A photoluminescence light having a center wavelength of 700 nm and a half-width of 150 nm could be obtained. The visible color is orange.

Embodiment 2

Figure 2:
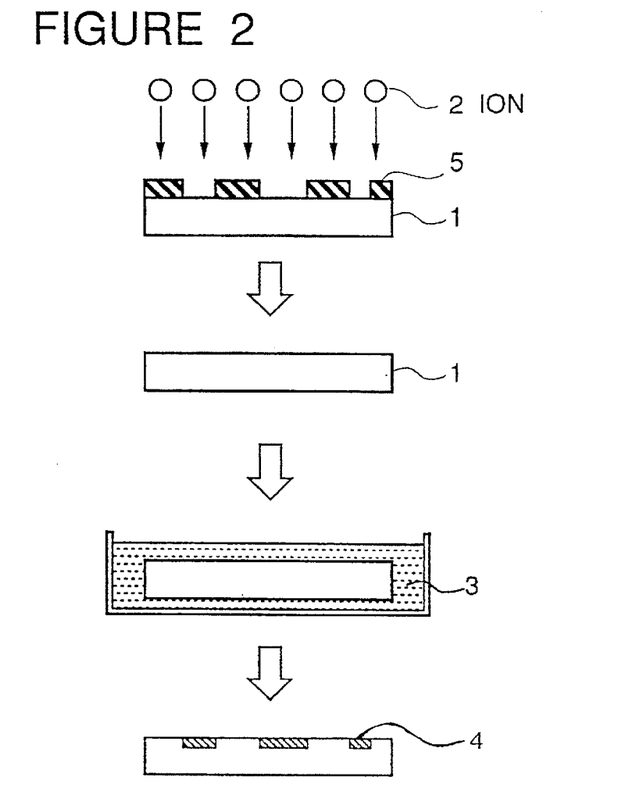
FIG. 2 is a process flow diagram illustrating a second embodiment of the method in accordance with the present invention for forming a photoluminescence layer on a semiconductor layer.

The first embodiment can be modified as shown in FIG. 2. A mask 5 is located on the substrate when irradiated with ions. Thus, a photoluminescence region can be selectively formed by irradiating with ions through the mask. The mask can be located spaced from the substrate.

Embodiment 3

Figure 4:
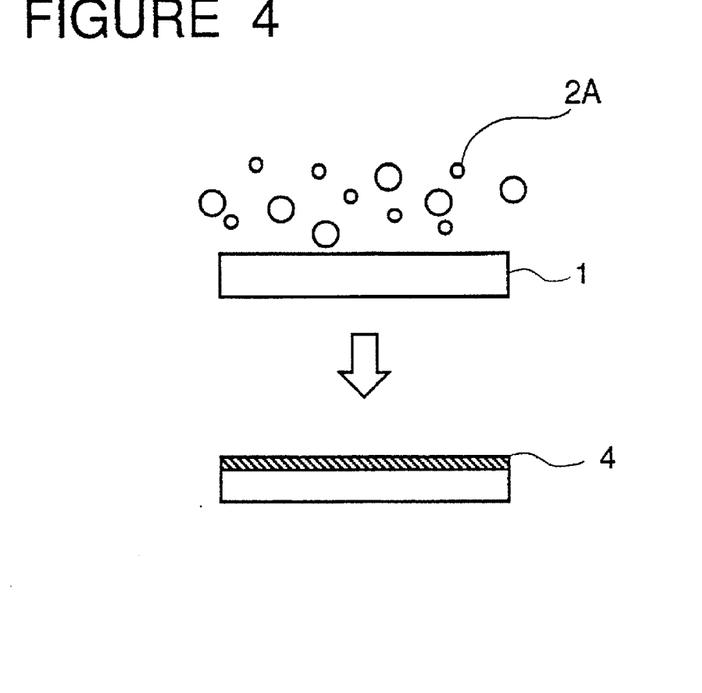
FIG. 4 is a process flow digaram illustrating a third embodiment of the method in accordance with the present invention for forming a photoluminescence layer on a semiconductor layer.

A substrate 1 is located in a plasma irradiating apparatus (not shown), and a suitable gas source is introduced into the apparatus, so that plasma 2A is used to irradiate the substrate from a suitable ion source a suitable dose as shown in FIG. 4. As one example, the substrate 1 is formed of a P-type or N-type (100) silicon substrate. As ions, hydrogen gas or a gas containing hydrogen is used. For example, the gas containing hydrogen can be exemplified by $CH_4$, $C_2H_6$, $C_3H_8$, $CHF_3$, $CClH_3$, HF. Alternatively, the hydrogen gas or the gas containing hydrogen can be mixed with inert gas such as Ne or Ar, in order to increase ion the irradiation effect.

These gases are introduced into the plasma irradiation apparatus, and the plasma 2A is generalred, so that the substrate 1 is exposed to the plasma. The generation condition for the plasma are a high frequency power of 300 W, and a duration of plasma irradiation of a few minutes to a few tens of minutes. Thus, a photoluminescence layer 4 is formed on the surface irradiated with the plasma 2.

Confirmation of photoluminescence can be performed by irradiating a visible or ultraviolet exciting ray obtained from an argon laser, a Krypton laser, a mercury lamp, a xenon lamp, etc., and observing an emitted visible or infrared ray. The wavelength of the emitted ray can be controlled by changing the concentration of plasma, the plasma power and the amount of plasma irradiation.

Embodiment 4

Figure 5:
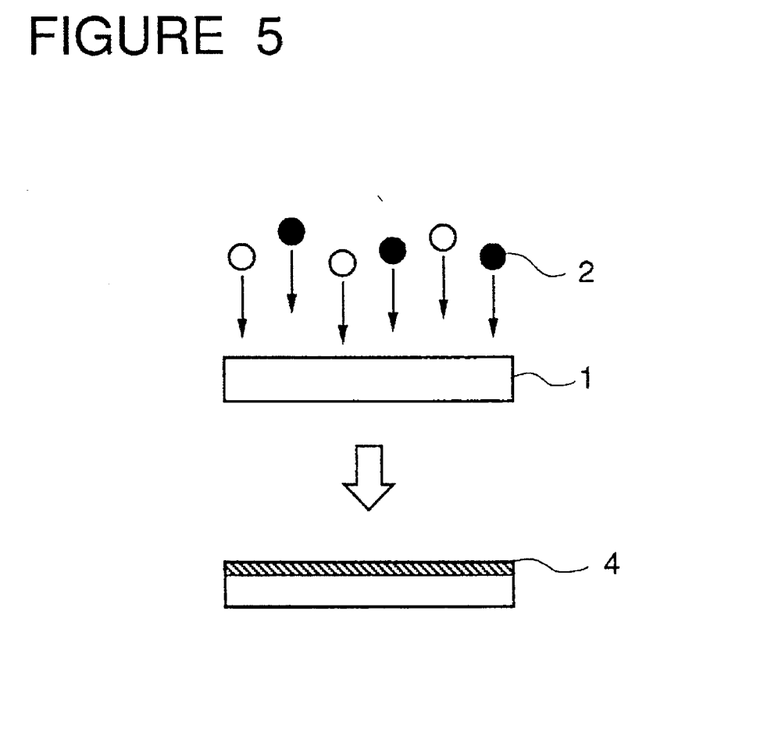
FIG. 5 is a process flow diagram illustrating a fourth embodiment of the method in accordance with the present invention for forming a photoluminescence layer on a semiconductor layer.

A substrate 1 is located in an ion irradiating apparatus (not shown), and suitable ions 2 are used to irradiate the substrate from a suitable ion source at a suitable dose as shown in FIG. 5. As one example, the substrate 1 is formed of a P-type or N-type (100) silicon substrate. As ions, hydrogen gas or a gas containing hydrogen is used. For example, the ions containing hydrogen can be exemplified by $CH_4$, $C_2H_6$, $C_3H_8$, $CHF_3$, $CClH_3$, HF.

For example, the ion irradiation condition is that the acceleration voltage is 300 V, the ion current density is 10 $\mu A/cm^2$ and the irradiation time is one minute to ten minutes. Thus, the photoluminescence layer 4 is formed on the surface that has been irradiated. The wavelength of the emitted ray can be controlled by changing the density of ion irradiation the acceleration voltage of ions, and the ion irradiation time.

If a mask is located on the substrate during irradiation, a photoluminescence region can be selectively formed by irradiating through the mask. The mask can be located spaced from the substrate.

Embodiment 5

Figure 6:
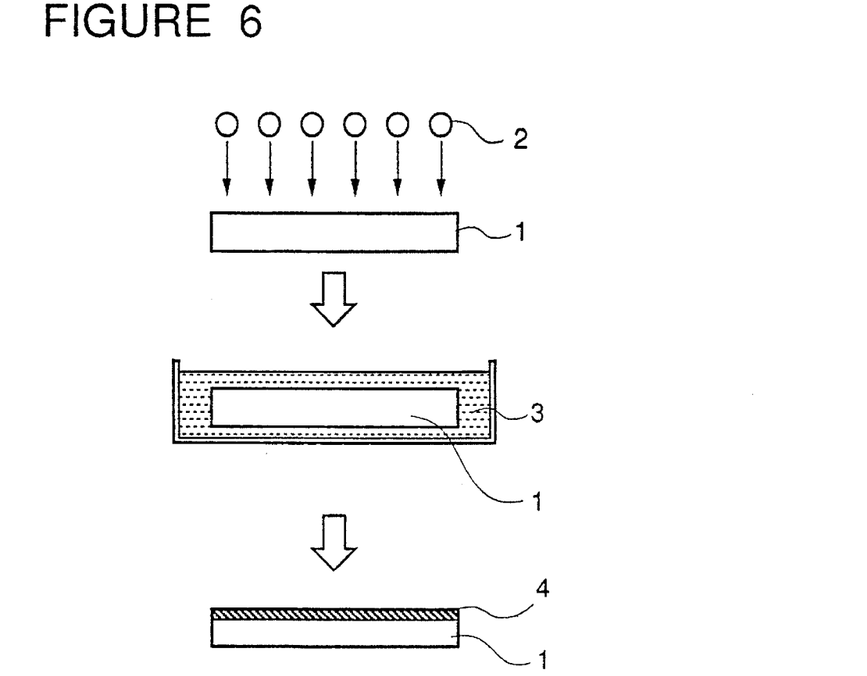
FIG. 6 is a process flow diagram illustrating a fifth emobidment of the method in accordance with the present invention for forming a photoluminescence layer on a semiconductor layer.

A substrate 1 is located in an ion implantation apparatus (not shown) and ions 2 are caused to irradiate the substrate from a suitable ion source at a suitable dose, as shown in FIG. 6. As one example, the semiconductor substrate 1 is formed of a P-type or N-type (100) silicon substrate. Ions 2 obtained from the ion source are generated under acceleration voltage of 10 KV to 100 KV and at a dose of $10^{13}/cm^2$ to $10^{16}/cm^2$.

By changing the above mentioned ion implantation condition, it is possible to control the photoumninescence intensity, the thickness of the photoluminescence layer, and the depth of the photoluminescence layer, after the manufacturing.

After the ion irradiation, the substrate is taken out from the ion implantation apparatus, and then, is immersed in a hydrofluoric acid solution 3. For example, the hydrofluoric acid solution is composed of a 49%-aqueous hydrofluoric acid, or a mixed liquid of 5 parts of 49%-aqueous hydrofluoric acid and 3 parts of ethanol. The concentration of the hydrofluoric acid and the mixing ratio of the hydrofluoric acid and the ethanol can be changed over a wide range. The photoluminescence intensity can be controlled by the concentration of the hydrofluoric acid and the immersing time. Thus, the ion-implanted region can form a photoluminescence layer 4.

Confirmation of photoluminescence can be performed by irradiating with a visible or ultraviolet exciting ray obtained from an argon laser, a Krypton laser, a mercury lamp, a xenon lamp, etc., and observing an emitted visible or infrared ray. The wavelength of tile emitted ray can be controlled by changing the amount of ion implantation, the acceleration voltage of ions, and the immersing time into the hydrofluoric acid or hydrofluoric acid solution.

Embodiment 6

Figure 7:
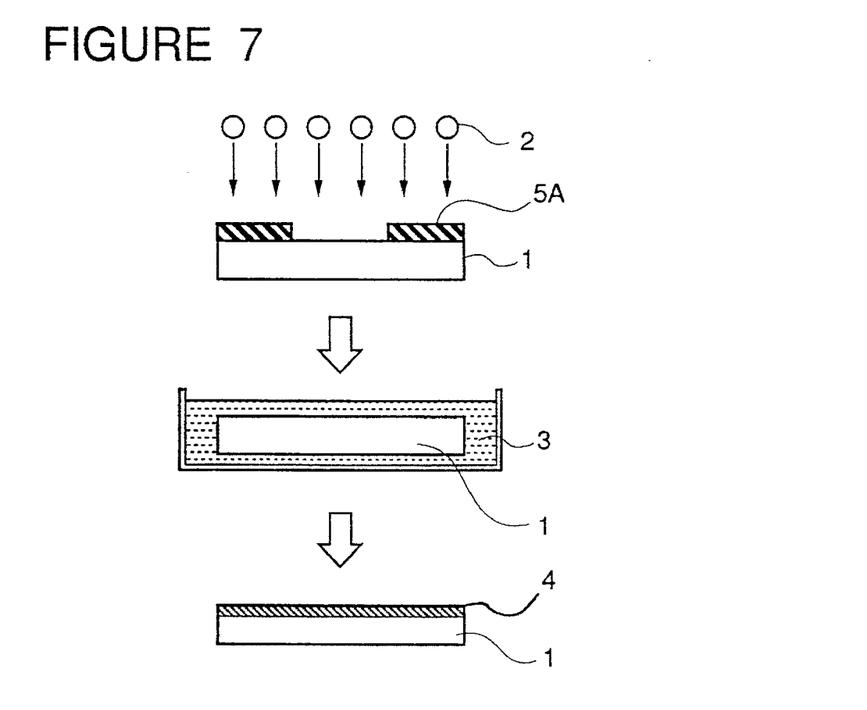
FIG. 7 is a process flow diagram illustrating a sixth embodiment of the method in accordance with the present invention for forming a photoluminescence layer on a semiconductor layer.

As shown in FIG. 7 a mask 5A is located on the substrate when ions are implanted. Thus, a photoluminescence region 4 can be selectively formed on the substrate 1 by implanting ions through the mask 5. The mask 5 can be located spaced from the substrate 1. In addition, the mask can be used when the substrate is immersed into the hydrofluoric acid or hydrofluoric acid solution.

Embodiment 7

Figure 8:
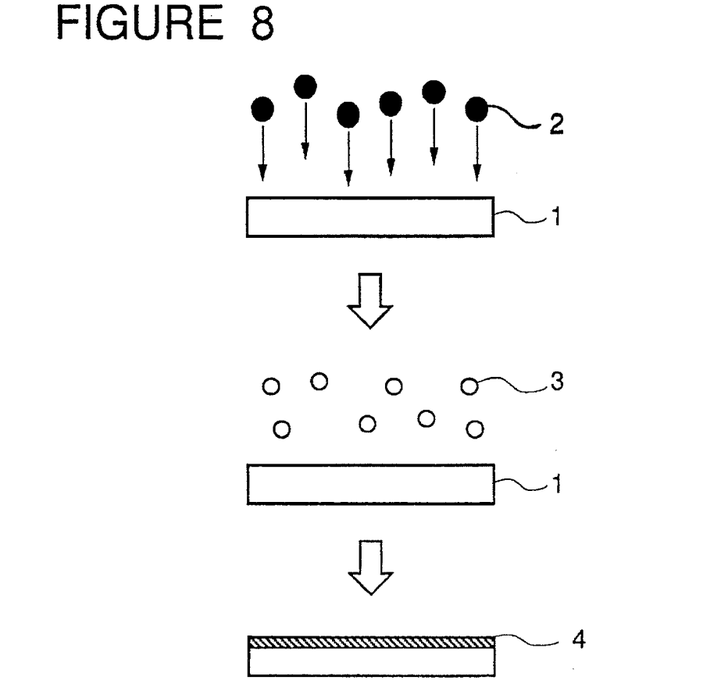
FIG. 8 is a process flow diagram illustrating a seventh embodiment of the method in accordance with the present invention for forming a photoluminescence layer on a semiconductor layer.

Referring to FIG. 8, there is shown s seventh embodiment. A substrate 1 is located in an ion irradiation or implantation apparatus (not shown), and ions 2 are caused to irradiate the substrate from a suitable ion source at a suitable dose. As one example, the semiconductor substrate 1 is formed of a P-type or N-type (100) silicon substrate. Ions 2 are composed of rare gas such as argon or a reactive gas such as chlorine. These gases are introduced into the ion irradiation or implantation apparatus so that the ions 2 are generated. One example of the generation condition is that the acceleration voltage is of 100 V to 1000 KV and a dose is of $10^{12}/cm^2$ to $10^{24/cm2}$.

Thereafter, the substrate is introduced into a hydrogen plasma or hydrogen ion irradiation apparatus (not shown), so that the substrate 1 is exposed to the hydrogen plasma 3, or the hydrogen ion 3 is caused to irradiate the substrate 1. One example of the irradiation condition is that the high frequency power is 300 W the gas pressure is $10^{-4}$ Torr, and the irradiation time is one minute to ten minutes.

As a result, ion 3 irradiates or is implanted in the substrate 1. Thus, the hydrogen plasma or ion implanted region can form a photoluminescence layer 4.

Confirmation of photoluminescence can be performed by irradiating with a visible or ultraviolet exciting ray obtained from an argon laser, a Krypton laser, a mercury lamp, a xenon lamp, etc., and observing an emitted visible or infrared ray. The wavelength of the emitted ray can be controlled by changing the amount of ion implantation, the acceleration voltage of ions, the hydrogen plasma density, the hydrogen plasma power, the irradiation amount of the hydrogen plasma or the hydrogen ions, the acceleration voltage of the hydrogen ions. The thickness and the depth of the photoluminescence layer can be controlled by the hydrogen plasma density and the acceleration voltage of the hydrogen ions.

Embodiment 8

Figure 9:
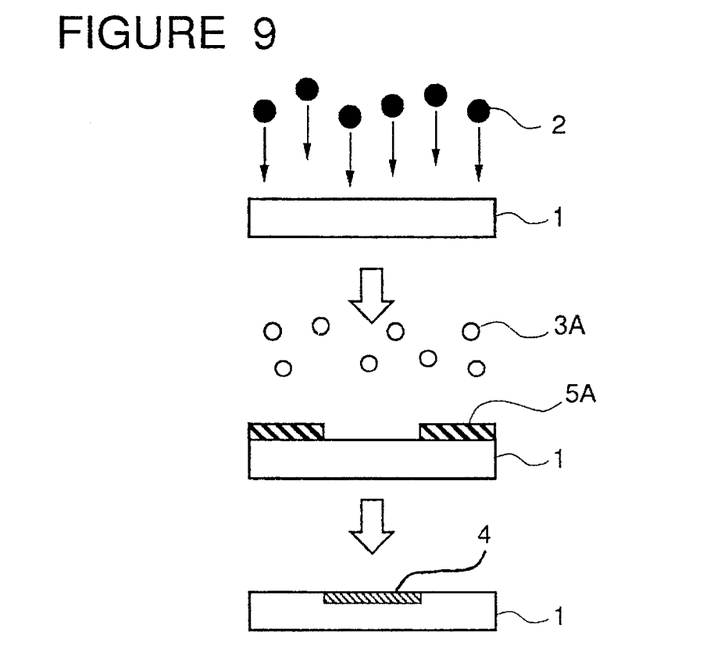
FIG. 9 is a process flow diagram illustrating an eighth embodiment of the method in accordance with the present invention for forming a photoluminescence layer on a semiconductor layer.

As shown in FIG. 9 a mask 5A is located on the substrate when ions irradiated. Thus, a photoluminescence region 4 can be selectively formed on the substrate 1 by irradiating with ions 2 through the mask 5A. The mask can be locatated spaced from the substrate.

In addition. If the mask 5A is provided when the hydrogen plasma or the hydrogen ions irradiate, the photoluminescence region 4 can also be selectively formed. In this case, an ion irradiation damage is given to a region which has been converted into non-photoluminescence by the first ion irradiation.

In the above mentioned embodiments, silicon was used as the semiconductor material, but if germanium which is an indirect transition semiconductor similarly to silicon is used, a photoluminescence layer having an excellent uniformity can be formed in the same method. In addition, a photoluminescence layer can be formed in accordance with the method of the present invention by using GaAs, InP and their mixed crystal, which are a direct transition semiconductor. In this case, it is possible to obtain photoluminescence having a wavelength which is difficult to obtain in a method utilizing a direct transition type bandgap. Accordingly, this is also effective in controlling the photoluminescence intensity and the thickness of the photoluminescence layer.

Embodiment 9

Figure 10:
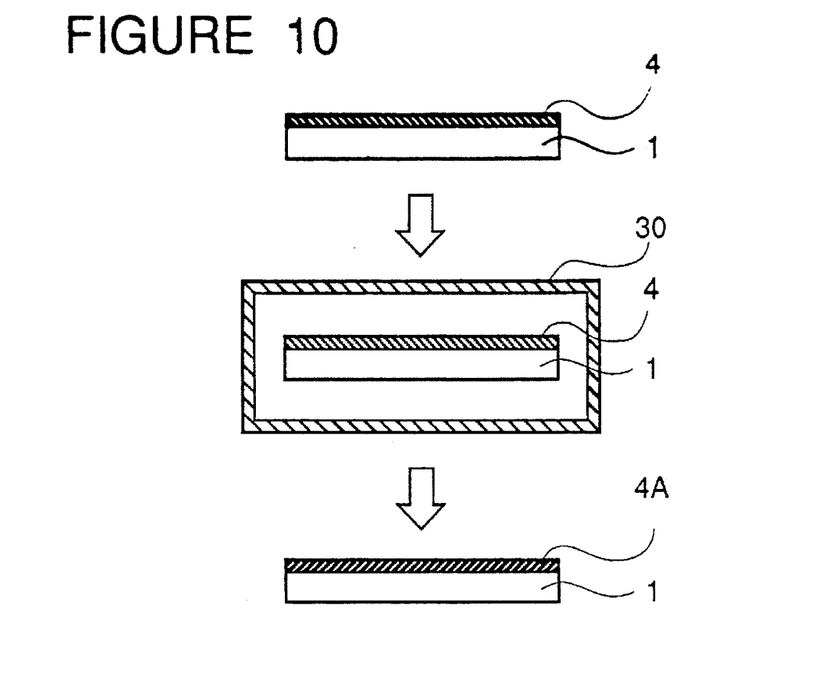
FIG. 10 is a process flow diagram illustrating a ninth embodiment of the method in accordance with the present invention for forming a photoluminescence layer on a semiconductor layer.

Now, a ninth embodiment will be described with reference to FIG. 10.

An electrode (not shown) is formed on a rear surface of a substrate 1 in order to increase uniformity of the anodizing. This electrode can be formed by depositing aluminum on the rear surface of the substrate and then by performing a heat treatment at 500° C. for one hour. Thus, the substrate is used as an anode, and a cathode formed of platinum is used. The electrolytic solution is composed of a 49%-aqueous hydrofluoric acid or a mixed liquid of 5 parts of 49%-aqueous hydrofluoric acid and 3 pans of ethanol. A current is applied with a current density of 10 mA/cm$^2$ to 50 mA/cm$^2$ for a few minutes to 30 minutes. Thus, a photoluminescence layer 4 is formed on a front surface of the substrate 1.

Thereafter, the substrate 1 is located in a heater 30. A heating atmosphere may be an inert gas such as a nitrogen gas, or vacuum, or an oxygen atmosphere. In the case that the substrate is heat-treated in the inert gas or in vacuum, the higher the heating temperature is, the more the photoluminescence intensity of the photoluminescence layer 4 is reduced.

For example, the photoluminescence intensity of the photoluminescence layer heat-treated at 300° C. for one hour is smaller than the photoluminescence intensity of the photoluminescence layer heat-treated at 600° C. for one hour, which is further smaller than the photoluminescence intensity of the photoluminescence layer heat-treated at 800° C. for one hour.

In order to completely inhibit the photoluminescence, it is preferred to heat in oxygen. For example, when the substrate 1 is heated in the oxygen atmosphere at 700° C. for one hour, the photoluminescence is completely inhibited.

Embodiment 10

Figure 11:
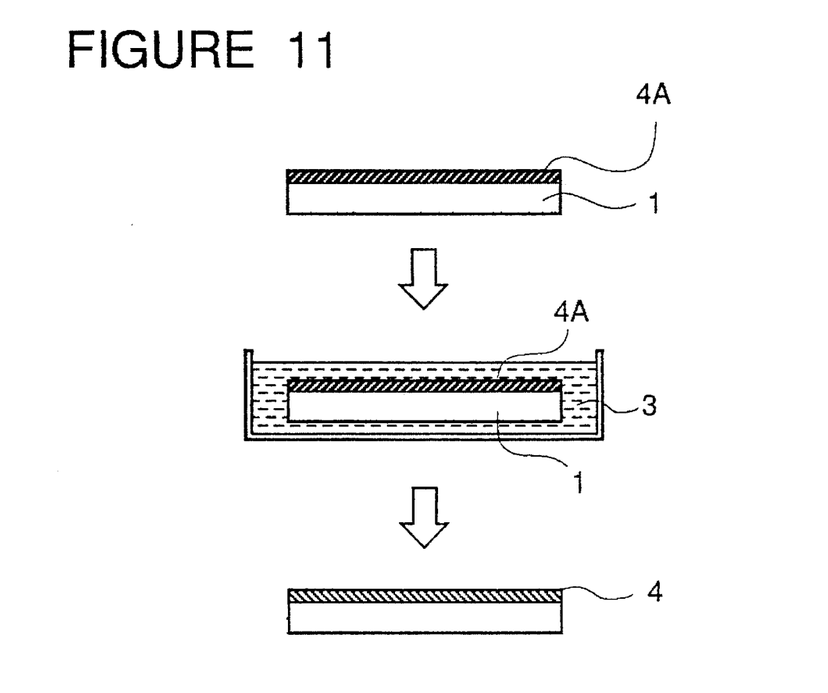
FIG. 11 is a process flow diagram illustrating a tenth embodiment of the method in accordance with the present invention for forming a photoluminescence layer on a semiconductor layer.

FIG. 11 illustrates tenth embodiment for restoring the photoluminescence intensity of the photoluminescence layer. The substrate 1 having the photoluminescence layer 4A of reduced or inhibited photoluminescence intensity is immersed into a hydrofluoric acid or a solution mainly composed of hydrofluoric acid for one minute to ten minutes. As a result, the photoluminescence layer 4 having restored photoluminescence intensity can be obtained. By changing the immersing time, the degree of the restoring of the photoluminescence intensity can be controlled.

Embodiment 11

Figure 12:
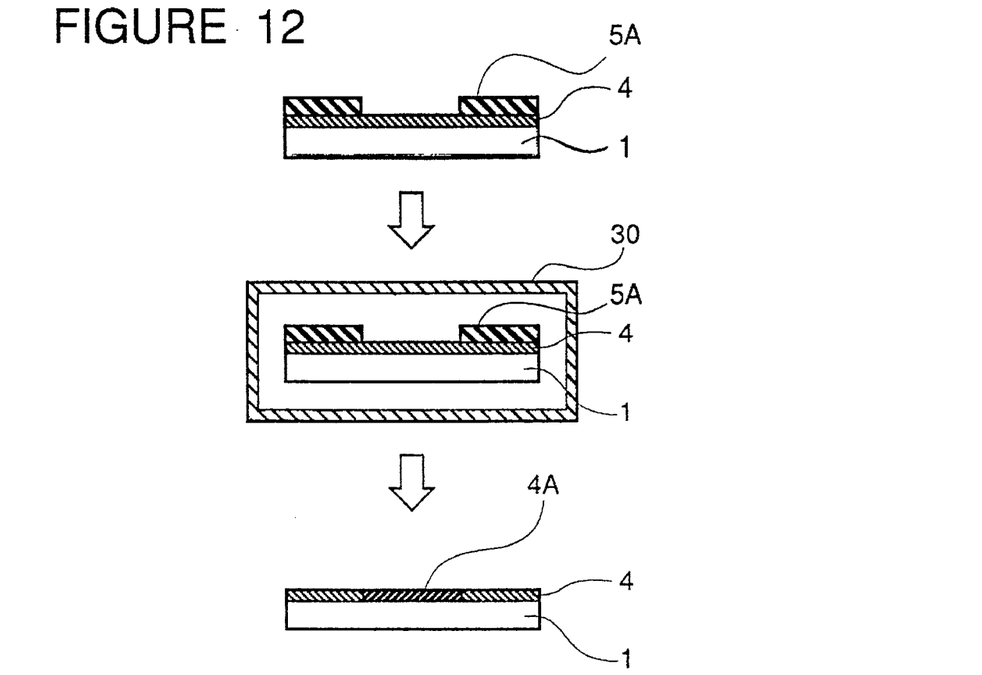
FIG. 12 is a process flow diagram illustrating an eleventh embodiment of the method in accordance with the present invention for forming a photoluminescence layer on a semiconductor layer.

FIG. 12 illustrates an eleventh embodiment in which a mask 5A is provided on the photoluminescence layer 4 when the heating treatment is perforated for reducing or inhibiting the photoluminescence intensity. In an exposed region of the photoluminescence layer 4, the photoluminescence intensity is reduced, but in the, masked region, removal of hydrogen is suppressed, so that after the heating treatment, the photoluminescence intensity is not reduced. After the heating treatment, the mask 5A is removed, so that the photoluminescence intensity reduced or inhibited region 4A is formed on a selected position of the substrate.

Embodiment 12

Figure 13:
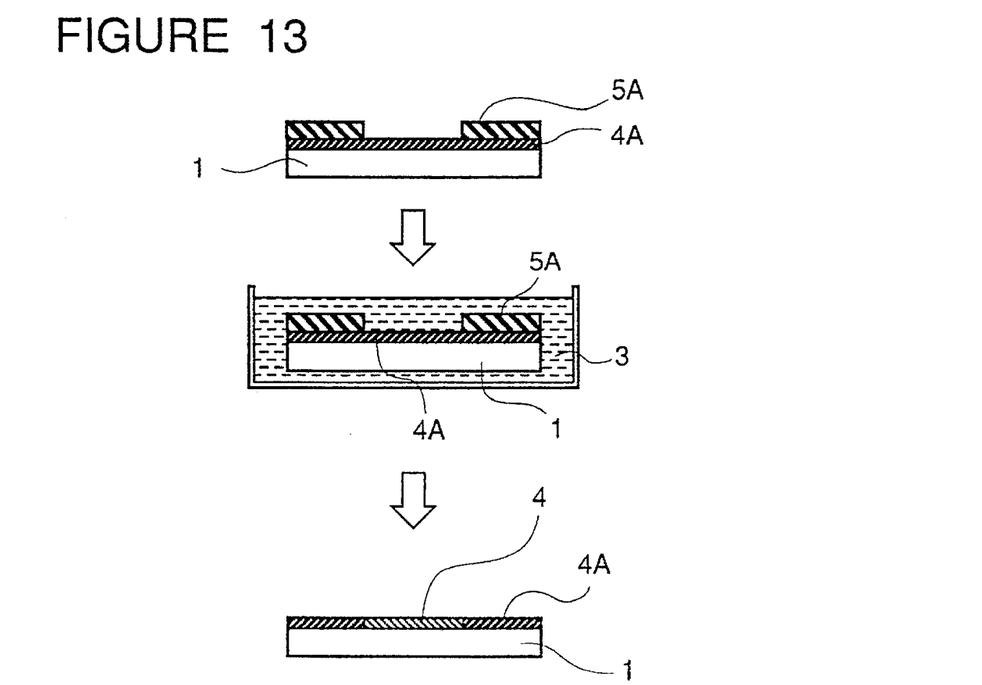
FIG. 13 is a process flow diagram illustrating a twelfth embodiment of the method in accordance with the present invention for forming a photoluminescence layer on a semiconductor layer.

FIG. 13 illustrates a twelfth embodiment in which a mask 5A is provided on the photoluminescence layer 4 when the hydrofluoric acid treatment is performed for restoring the photoluminescence intensity. The mask 5A is located on a selected region of the photoluminescence intensity reduced or inhibited layer 4A, so that the photoluminescence intensity is restored in the portion exposed to the hydrofluoric acid.

Embodiment 13

Figure 14:
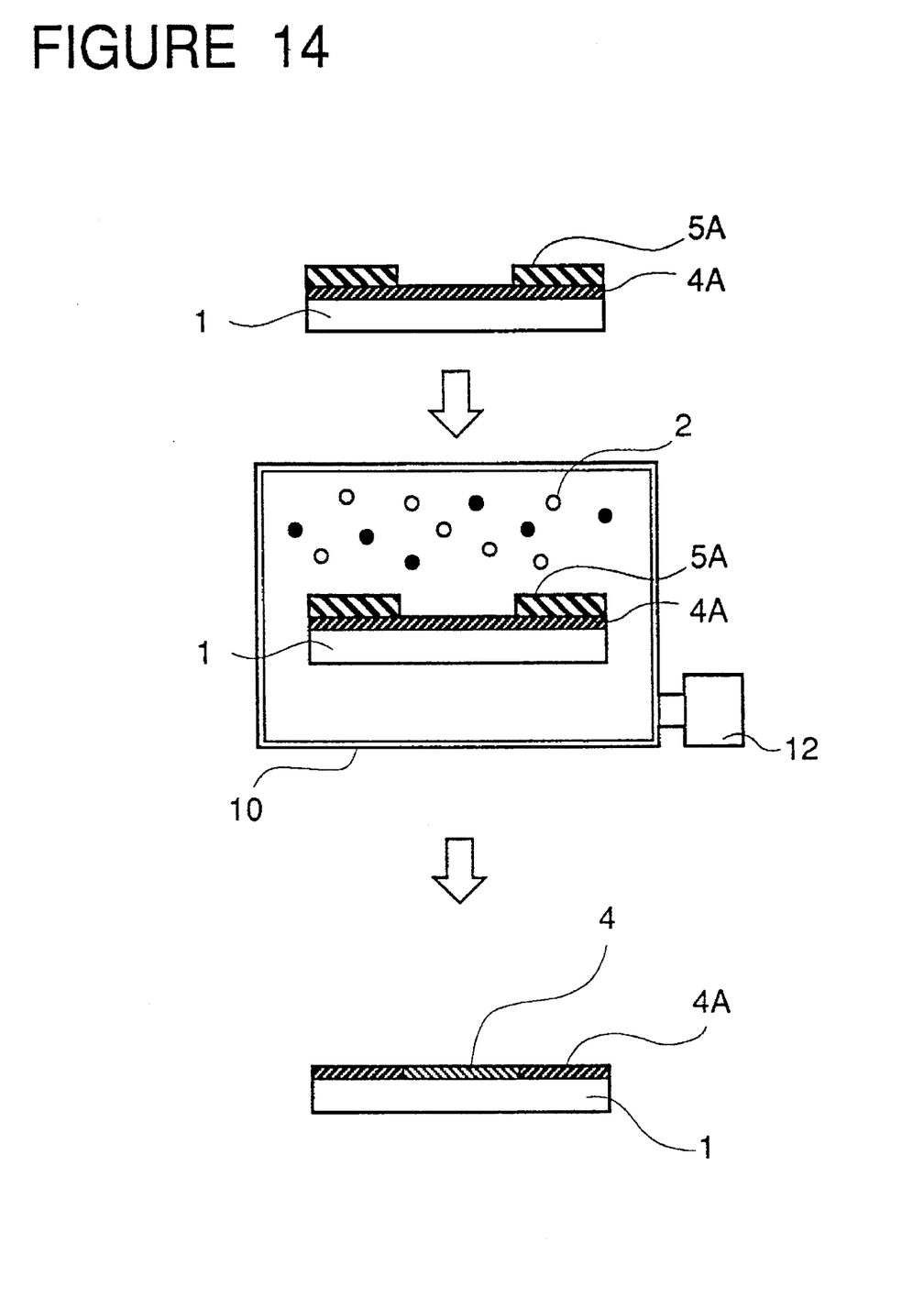
FIG. 14 is a process flow diagram illustrating a thirteenth embodiment of the method in accordance with the present invention for forming a photoluminescence layer on a semiconductor layer.

FIG. 14 shows a thirteenth embodiment for restoring the photoluminescence intensity. The substrate 1 having the photoluminescence intensity reduced or inhibited layer 4A is introduced into a plasma or ion generation apparatus 10, and deaerated by means of a vacuum pump 12. Hydrogen ions or ions containing hydrogen are irradiated to the photoluminescence intensity reduced or inhibited layer 4A, or the photoluminescence intensity reduced or inhibited layer 4A is exposed to hydrogen plasma or plasma including hydrogen. As a result, the photoluminescence intensity is restored in a portion of photoluminescence intensity reduced or inhibited layer 4A exposed to the plasma or the ions.

In this embodiment, by changing the irradiation time of the ions or the plasma, the degree of the restoring of the photoluminescence intensity can be controlled. Accordingly, by providing the mask 5A on the photoluminescence intensity reduced or inhibited layer 4A, the photoluminescence intensity can be selectively restored.

In the above mentioned embodiments, the anodizing has been used for forming the photoluminescence layer. However, as mentioned hereinbefore, the photoluminescence layer can be formed by irradiating ions and the immersing it into a hydrofluoric acid, similarly to the first embodiment.

In the above mentioned embodiments, silicon was used as the semiconductor material, but even if germanium which is an indirect transition semiconductor similarly to silicon is used, and if GaAs, InP and their mixed crystal (which are a direct transition semiconductor) is used, a photoluminescence intensity can be reduced, inhibited or restored in the same method.

The invention has thus been shown and described with reference to the specific embodiments. However, it should be noted that the present invention is in no way limited to the details of the illustrated structures but changes and modifications may be made within the scope of the appended claims.

I claim:

1. A method for forming a photoluminescence layer on a substrate having a silicon surface portion, said photoluminescence layer emitting light at an intensity and a wavelength, by performing the steps of irradiating with ions said surface portion where the photo luminescence layer is to be formed;

immersing said surface portion in a solution containing hydrofluoric acid; and controlling at least one of a solution concentration and an immersion time in said solution in order to control said intensity and said wavelength;

whereby the ion-irradiated and hydrofluoric acid-treated surface portion forms the photoluminescence layer.

2. A method as claimed in claim 1, in which said ions are hydrogen ions.

3. A method as claimed in claim 1, in which said ions are chlorine ions.

4. A method as claimed in claim 1, in which said ions are rare gas ions.

5. A method as claimed in claim 4, wherein said rare gas is argon.

* * * * *